United States Patent
Takekoshi

(10) Patent No.: US 6,812,472 B2
(45) Date of Patent: Nov. 2, 2004

(54) NON-MAGNETIC ROBOTIC MANIPULATORS FOR MOVING OBJECTS RELATIVE TO A CHARGED-PARTICLE-BEAM OPTICAL SYSTEM

(75) Inventor: Hidekazu Takekoshi, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/612,572

(22) Filed: Jul. 1, 2003

(65) Prior Publication Data

US 2004/0007677 A1 Jan. 15, 2004

(30) Foreign Application Priority Data

Jul. 1, 2002 (JP) .......................................... 2002-191692

(51) Int. Cl.[7] .............................................. H01J 37/20
(52) U.S. Cl. ............................... 250/492.2; 250/442.11; 250/441.11
(58) Field of Search ....................... 250/492.2, 442.11, 250/441.11

(56) References Cited

U.S. PATENT DOCUMENTS

2003/0012631 A1 * 1/2003 Pencis et al. ............ 414/744.5
2003/0131458 A1 * 7/2003 Wang et al. ................. 29/25.01
2004/0019408 A1 * 1/2004 del Puerto et al. ........... 700/245
2004/0027552 A1 * 2/2004 Kikuchi et al. ................ 355/75

* cited by examiner

Primary Examiner—John R. Lee
Assistant Examiner—James J. Leybourne
(74) Attorney, Agent, or Firm—Klarquist Sparkman LLP

(57) ABSTRACT

In the context of charged-particle-beam (CPB) microlithography systems, robotic manipulators are disclosed for conveying objects such as reticles and substrates simultaneously with performing exposures without causing significant perturbation of the charged particle beam. To such end, the subject manipulators comprise moving members that are made of substantially non-magnetic materials. As the moving members move in the vicinity of a magnetic field controlling exposure-beam trajectory, the beam trajectory is less affected by stray magnetic fields that otherwise would be generated if the moving members were made of magnetic materials. Hence, for better throughput, reticle and/or substrate conveyance can be conducted while exposures are being performed, without adversely affecting exposure accuracy.

31 Claims, 3 Drawing Sheets

NON-MAGNETIC ROBOTIC MANIPULATORS FOR MOVING OBJECTS RELATIVE TO A CHARGED-PARTICLE-BEAM OPTICAL SYSTEM

FIELD

This disclosure pertains to microlithography, which is a process by which a pattern is transferred from a mask or reticle to a lithographic substrate, such as a semiconductor wafer, using an energy beam. More specifically, the disclosure pertains to microlithography performed using a charged particle beam such as an electron beam or ion beam. Even more specifically, this disclosure pertains to robotic manipulators used in conjunction with charged-particle-beam (CPB) microlithography systems for, e.g., moving reticles and substrates into and out of position for exposure.

BACKGROUND

Conventional CPB microlithography systems typically include at least one robotic manipulator used for conveying pattern-defining reticles or masks (termed "reticles" herein) and/or lithographic substrates into and out of position for exposure. Robotic manipulators are highly desirable over manual manipulation of these objects for many reasons, including rapidity and consistency of operation as well as cleanliness, etc. For example, a robotic manipulator usually is used for moving semiconductor wafers, coated with resist, from a wafer cassette to a substrate stage on which the substrates are exposed individually and for moving exposed substrates to cassette that holds exposed wafers. A robotic manipulator also is used for moving reticles from a reticle cassette to a reticle stage, on which the reticles are held individually for exposure, and for moving reticles, after use for exposure, back to the reticle cassette. In a CPB microlithography system, these conveying motions performed by the respective robotic manipulators include motions into and out of vacuum chambers, which involves motions into and out of load-lock chambers, gate valves between chambers, and the like. Typically, the entire motion sequence for reticles and wafers is completely automated to avoid any direct human contact with the substrates and reticles. A typical robotic manipulator includes a moving member, such as an arm, as well as machine components such as ball screws and bearings. For maximal durability, these various components conventionally are made of metal, more specifically magnetic metal.

For maximal "throughput" (i.e., number of substrates that can be processed microlithographically per unit time), motions of reticles and substrates by the robotic manipulators usually occur while lithographic exposures are being performed simultaneously, at least to some degree. However, as a manipulator made of magnetic material is operated so as to cause movement of a part of the manipulator, the manipulator produces a moving "stray" magnetic field. If the moving part of the manipulator is located near an exposure location or near the trajectory of the charged particle beam, the moving magnetic field can cause a significant perturbation of the beam trajectory and/or exposure fidelity, which typically results in a distortion or other imaging fault of the pattern as actually formed on the resist-coated substrate.

Exemplary stray magnetic fields generated in this manner include direct-current (DC) disturbances originating in the magnetic materials of motors built into the manipulators, direct-current/alternating-current (DC/AC) disturbances generated by electrical currents flowing to and from the manipulator, and DC/AC disturbances generated during actuation of the manipulator. Among these various disturbances, a particularly large disturbance is manifest in the magnetic-field fluctuations caused by movement of magnetic materials such as the arm of a robotic manipulator during actuation of the manipulator.

Microlithographic exposures typically occur at or near the optical axis of the CPB microlithography system. In such systems (e.g., electron-beam microlithography systems), a stray magnetic field (e.g., as generated by a motor or other source in a robotic manipulator) has a magnitude that decreases in inverse proportion to the square of the distance between the source of the field and the optical axis. With robotic manipulators having a wide range of arm motion, the effects of stray magnetic fields conventionally are reduced by installing the "main unit" (containing motors and the like) of the manipulator at a maximal distance from the optical axis. However, if the arm itself is made of a magnetic material, then significant magnetic-field fluctuations affecting the beam trajectory tend to occur regardless of the distance between the main unit and the optical axis. These effects arise due to the rather large operational range of the arm and to the arm closely approaching the optical axis at least during some of its motions.

Plots of magnetic-field intensity (B) resulting from representative movements of a conventional robotic manipulator are shown in FIG. 3, in which the ordinate is output in volts and the abscissa is time (sec). The plots were generated by periodically moving the robotic manipulator in the vertical (Z) direction while measuring magnetic-field intensity B at a location that is separated by approximately 300 mm from the center position of the manipulator. Sensor output was in volts. In this example the manipulator was made of a magnetic stainless steel. Measurements of the magnetic-field intensity were performed using a 3-axis DC sensor (DC to approximately 5 Hz, resolution 5 $\mu$Gauss). The solid-line plot denotes magnetic-field intensity ($B_x$) in the X-direction at the measurement point; the dot-dashed line denotes magnetic-field intensity ($B_y$) in the Y-direction at the measurement point; and the dashed line denotes magnetic-field intensity ($B_z$) in the Z-direction at the measurement point.

FIG. 3 indicates that vertical (Z-direction) movement of the robot produces a magnetic-field fluctuation of approximately 6.8 mG in the X-direction, approximately 2.0 mG in the Y-direction, and approximately 0.4 mG in the Z-direction. Conventionally, active magnetic-field cancellers have been used for reducing the magnitude of these magnetic-field disturbances. An "active" magnetic-field canceller comprises an energizable component such as a Helmholtz coil or the like in surrounding relationship to a field-vulnerable portion of the microlithography system. The Helmholtz coil is energized in a controllable manner by a coil-energization circuit. The active canceller also includes a Gauss meter situated and configured to measure the magnitude of a potentially disturbing magnetic field in the vicinity of the field-vulnerable portion and to provide data regarding the detected field to the coil-energization circuit in a feedback manner. Thus, the coil-energization circuit supplies electrical current to the Helmholtz coil based on field measurements obtained by the Gauss meter. In response to a detected magnetic field that potentially could disturb the beam, the Helmholtz coil generates a countervailing magnetic field having a magnitude equal to that of the detected field but a direction opposite the direction of the detected field. As a result, the detected field is canceled.

Due to the high intensity and wide distribution of the magnetic field produced by Helmholtz coils and to limitations on the size of the Gauss meter, it is difficult to install the Gauss meter in a confined space ("target space") in which magnetic-field cancellation is desired and to achieve ideal field cancellation. To solve this problem one or more small correcting coils conventionally are situated in the vicinity of the Gauss meter. The correcting coils are used for correcting deviations of the magnetic field between the actual installation position of the Gauss meter and the target space. Unfortunately, the correcting coils and Helmholtz coils are fixed in position. Use of a robotic manipulator that generates beam-disturbing magnetic fields requires use of multiple corrective-field-generation sources that are operated sequentially. As a result, the magnetic field at the location of the Gauss meter frequently does not correspond with the magnetic field of the target space on a one-to-one basis, resulting in substantial difficulty in canceling the potentially disturbing magnetic field accurately.

SUMMARY

According to a first aspect of the invention, charged-particle-beam (CPB) microlithography systems are provided. An embodiment of such a system comprises a CPB optical system situated and configured to irradiate a charged particle beam onto an exposure-sensitive surface of a lithographic substrate so as to transfer and imprint a resolved pattern on the exposure-sensitive surface. The system also includes a first robotic manipulator situated relative to the CPB optical system and configured for conveying an object relative to the CPB optical system. The first robotic manipulator comprises at least one moving member that moves, during actuation of the manipulator, relative to the CPB optical system. The at least one moving member is substantially non-magnetic, as defined herein.

By way of example, the first robotic manipulator can be configured to convey a reticle to a reticle stage for exposure and from the reticle stage after exposure. As another example, the first robotic manipulator can be configured to convey a lithographic substrate to a substrate stage for exposure and from the substrate stage after exposure.

Typically, the first robotic manipulator comprises multiple moving members including a first arm member and an object-holding member pivotably attached to the first arm member. In this configuration the object-holding member is used for holding the object as the first robotic manipulator moves the object in a vicinity of a magnetic field produced by the CPB optical system, and the first arm member and the holding member are each made of a substantially non-magnetic material (i.e., a material having a relative magnetic permeability of 1.0005 or less). In this regard, the non-magnetic material can be, for example, Ti or SiC or other material having the stated relative magnetic permeability.

The moving members of the first robotic manipulator also can include a first shaft pivotably coupling the object-holding member to the first arm member, wherein the first shaft is made of a substantially non-magnetic material. The multiple members also can include a second arm member and a second shaft connecting the first and second arm members together in a manner allowing the first arm member to pivot about the second shaft relative to the second arm member in response to actuation of the first robotic manipulator. In this configuration the second arm member and second shaft are each made of a substantially non-magnetic material.

The CPB optical system typically is contained inside a vacuum process chamber to which is connected at least a load chamber through which objects are transferred into and out of the vacuum process chamber. In this configuration the first robotic manipulator desirably is configured, when actuated, to move the object from the load chamber to the vacuum process chamber and from the vacuum process chamber to the load chamber. The load chamber can be connected to a load-lock chamber. In this latter configuration the first robotic manipulator desirably is configured to move, when actuated, the object from the load-lock chamber to the load chamber, from the load chamber to the vacuum process chamber, from the vacuum process chamber to the load chamber, and from the load chamber to the load-lock chamber. Also, desirably, the first robotic manipulator is located inside the load chamber.

If the vacuum process chamber comprises an optical column containing an illumination-optical system and a reticle stage, the first robotic manipulator desirably is configured to move, when actuated, a reticle relative to the illumination-optical system. This movement is from the load-lock chamber to the load chamber, from the load chamber to the reticle stage, from the reticle stage to the load chamber, and from the load chamber to the load-lock chamber. This configuration can include a second robotic manipulator situated and configured to move, when actuated, the reticle relative to the illumination-optical system. This latter movement is from an external environment to the load-lock chamber and from the load-lock chamber to the external environment. The second robotic manipulator comprises at least one moving member that moves, during actuation of the second robotic manipulator, relative to the illumination-optical system, wherein the at least one moving member is substantially non-magnetic.

If the vacuum chamber comprises a wafer chamber containing a projection-optical system and a substrate stage, the first robotic manipulator desirably is configured to move, when actuated, a lithographic substrate relative to the projection-optical system. This movement is from the load-lock chamber to the load chamber, from the load chamber to the substrate stage, from the substrate stage to the load chamber, and from the load chamber to the load-lock chamber. This configuration can include a second robotic manipulator situated and configured to move, when actuated, the substrate relative to the projection-optical system. This latter movement is from an external environment to the load-lock chamber and from the load-lock chamber to the external environment. The second robotic manipulator comprises at least one moving member that moves, during actuation of the second robotic manipulator, relative to the projection-optical system, wherein the at least one moving member is substantially non-magnetic.

If the CPB microlithography system has a first robotic manipulator used for transferring a substrate relative to a projection-optical system, the microlithography system can include a second robotic manipulator used for transferring a pattern-defining reticle. In this configuration the vacuum process chamber further comprises an optical column containing an illumination-optical system and a reticle stage, to which optical column are connected a second load chamber and a second load-lock chamber. The second robotic manipulator in this embodiment is configured to move, when actuated, a reticle relative to the illumination-optical system. This movement is from the second load-lock chamber to the second load chamber, from the second load chamber to the reticle stage, from the reticle stage to the second load chamber, and from the second load chamber to the second load-lock chamber.

Another embodiment of a CPB microlithography system comprises a first vacuum process chamber containing an illumination-optical system and reticle stage. A first load chamber is connected to the first vacuum process chamber, and a first robotic manipulator is situated and configured to move, when actuated, a reticle relative to the illumination-optical system. This movement includes movement from the first load chamber to the reticle stage in the first vacuum process chamber, and from the reticle stage to the first load chamber. The first robotic manipulator comprises moving members that are substantially non-magnetic. The CPB microlithography system of this embodiment also includes a second vacuum process chamber containing a projection-optical system and substrate stage. A second load chamber is connected to the second vacuum process chamber, and a second robotic manipulator is situated and configured to move, when actuated, a substrate relative to the projection-optical system. This movement includes movement from the second load chamber to the substrate stage in the second vacuum process chamber, and from the substrate stage to the second load chamber. The second robotic manipulator comprises moving members that are substantially non-magnetic.

In this embodiment the respective moving members of the first and second robotic manipulators are made of a material such as any of the specific materials listed earlier above.

The CPB microlithography system further can comprise a first load-lock chamber connected to the first load chamber and a second load-lock chamber connected to the second load chamber. In this configuration the first robotic manipulator can be further configured to move, when actuated, the reticle from the first load-lock chamber to the first load chamber and from the first load chamber to the first load-lock chamber. The second robotic manipulator can be further configured to move the substrate from the second load-lock chamber to the second load chamber and from the second load chamber to the second load-lock chamber. Desirably, the first robotic manipulator is located in the first load chamber, and the second robotic manipulator is located in the second load chamber.

This CPB microlithography system further can comprise a third robotic manipulator situated and configured to move, when actuated, the reticle from an external environment to inside the first load-lock chamber and from the first load-lock chamber to the external environment, and a fourth robotic manipulator situated and configured to move, when actuated, the substrate from the external environment to inside the second load-lock chamber and from the second load-lock chamber to the external environment. The third and fourth robotic manipulators each comprise respective moving members that are substantially non-magnetic. To such end the respective moving members of the third and fourth robotic manipulators desirably are made of a material such as any of the materials listed earlier above. Similarly, the respective moving members of the first and second robotic manipulators are made of a substantially non-magnetic material such as one or more of the materials listed earlier above.

Another aspect of the invention is set forth in the context of a CPB microlithography method in which a charged particle beam is directed through a CPB optical system that produces a beam-controlling magnetic field so as to imprint a pattern on an exposure-sensitive surface of a lithographic substrate. In this context methods are provided for conveying an object relative to the CPB optical system without causing a significant perturbation of the beam-controlling magnetic field. An embodiment of such a method comprises the step of placing the object on a moving member of a robotic manipulator situated relative to the CPB optical system and configured for conveying an object relative to the CPB optical system. The moving member is substantially non-magnetic. The robotic manipulator is actuated so as to move the object relative to the CPB optical system.

If, by way of example, the object is a reticle, the CPB optical system can comprise an illumination-optical system, wherein actuation of the robotic manipulator also moves the reticle relative to the illumination-optical system. Actuation of the robotic manipulator also can result in placement of the reticle on a reticle stage of the illumination-optical system and removing the reticle from the reticle stage.

If, by way of another example, the object is a substrate, the CPB optical system can comprise a projection-optical system, wherein actuation of the robotic manipulator also moves the substrate relative to the projection-optical system. Actuation of the robotic manipulator also can result in placement of the substrate on a substrate stage of the projection-optical system and removing the substrate from the substrate stage.

These actuations of the robotic manipulator can be performed while performing a lithographic exposure. By making the moving member(s) of the robotic manipulator substantially non-magnetic, movements of the moving member (s) during lithographic exposure does not produce significant fluctuation of the magnetic field controlling the beam during exposure. This eliminates the need to perform movements of the reticle and substrate, for example, only during times in which exposures are not being made. Consequently, throughput is increased over conventional apparatus and methods, without sacrificing exposure accuracy.

The foregoing and additional features and advantages of the invention will be more readily apparent from the following detailed description, which proceeds with reference to the accompanying drawings.

DETAILED DESCRIPTION

The invention is described below in the context of a representative embodiment that is not intended to be limiting in any way. This embodiment is described in the context of using an electron beam as a lithographic energy beam. However, it will be understood that the principles described herein are applicable with equal facility to use of another type of charged particle beam such as an ion beam.

Figure 2:
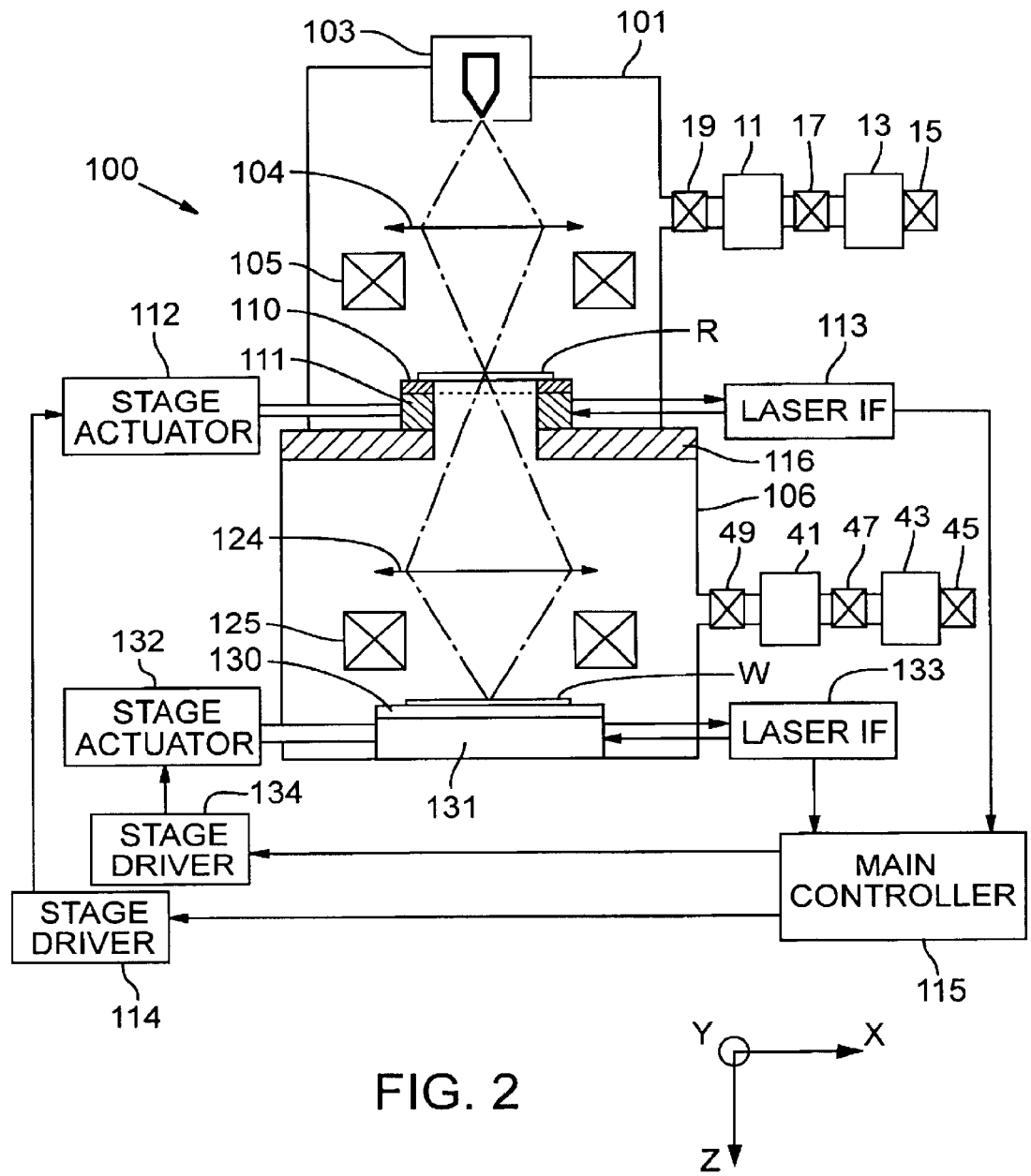
FIG. 2 is a schematic elevational diagram of certain image-formation and control relationships of an electron-beam microlithography system that includes at least one robotic manipulator as shown in FIGS. 1(A)–1(B).
Figure 3:
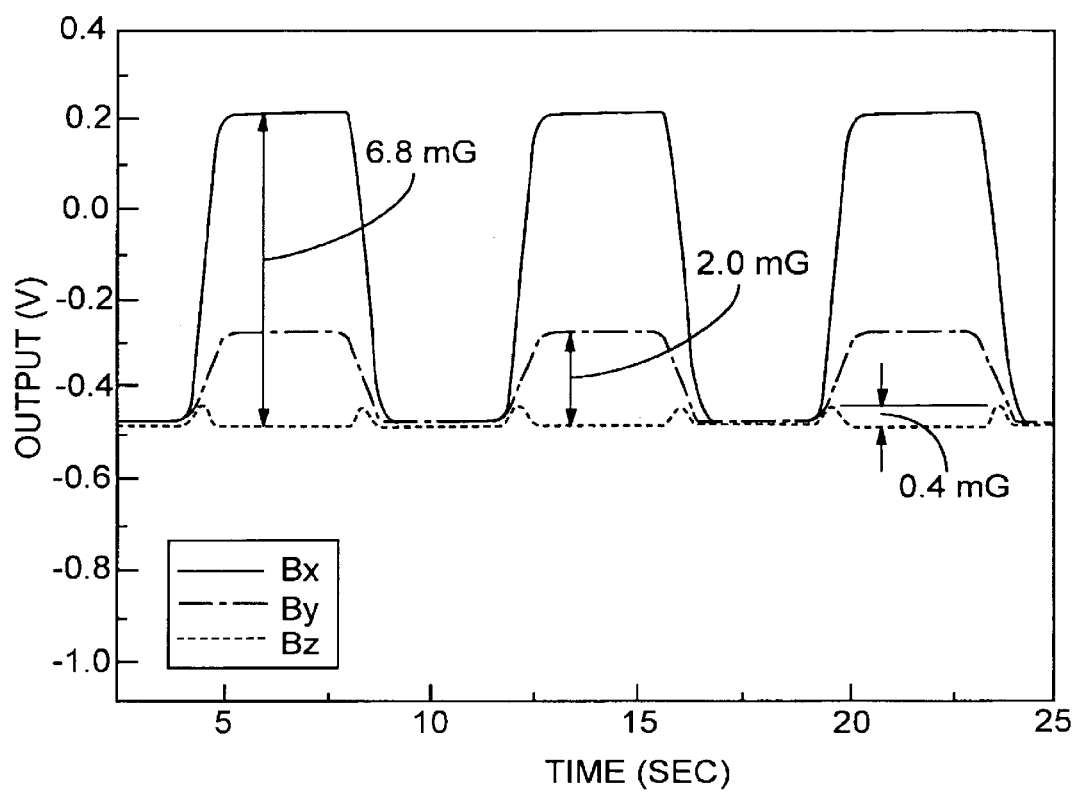
FIG. 3 shows plots of detected magnetic-field intensity that exhibit change due to movements of a conventional robotic manipulator.

Turning first to FIG. 2, an electron-beam microlithography system 100 is shown that comprises an optical "column" 101 situated at the upper portion of the figure. The optical column 101 is a configured as a vacuum process chamber containing an atmosphere that is evacuated to high vacuum by a vacuum pump (not shown but well understood in the art). An electron gun 103 is situated at the upstream end of the optical column 101 and emits an electron beam propagating in a downstream direction (downward in the figure)

from the electron gun 103. The optical column 101 also contains a condenser lens 104, a beam-scanning deflector 105, and a reticle (master-pattern plate) R arranged in this order downstream of the electron gun 103. Since the optical column 101 contains the reticle R, this column also is termed a "reticle chamber." The reticle R is moved into and out of the optical column 101 via a reticle-conveyance mechanism through a load chamber 11 and a load-lock chamber 13 that are connected in series to the optical column 101. Details of the reticle-conveyance mechanism and this manner of movement are described later below.

The reticle R defines a pattern to be transferred to a lithographic substrate. Since it currently is impossible to fabricate either a reticle or an electron-optical system capable of transferring an entire pattern in one exposure "shot," the reticle R is divided into multiple small regions (termed "subfields" herein) each defining a respective portion of the pattern. The electron beam emitted by the electron gun 103 is condensed by passage through the condenser lens 104 and scanned in the X-Y plane, using the beam-scanning deflector 105, so as to illuminate successive subfields on the reticle R in a sequential manner. The condenser lens 104 and beam-scanning deflector 105 constitute the "illumination-optical system" situated between the source 103 and the reticle R. The subfields are arrayed on the reticle R in rows and columns, wherein each row has a width approximately equal to the width of the optical field of the illumination-optical system. The beam-scanning deflector 105 scans the beam laterally to illuminate the subfields in each row in a continuous scanning manner. The illumination-optical system also includes a beam-trimming (beam-shaping) diaphragm, a blanking diaphragm, and a blanking deflector (these components are not shown but are well known in the art).

The reticle R is secured by electrostatic attraction to a reticle chuck 110 mounted to the upstream-facing surface of a reticle stage 111. The reticle stage 111 is mounted on a base 116 in the optical column 101. The reticle stage 111 is movable at least in the X- and Y-directions so as to facilitate scanning exposure of the subfields of the reticle R. This movability is provided by a stage actuator 112 shown at the left side of the reticle R in the figure. The stage actuator 112 is connected to a main controller 115 via a stage driver 114. The main controller 115 generates stage-motion command signals that are routed to the stage driver 114 and hence to the stage actuator 112 for controlled motions of the reticle R relative to the illumination-optical system. The position of the reticle stage 111 is monitored by a laser interferometer 113, shown at the right of the reticle stage 111. The laser interferometer 113 is connected to the main controller 115. Thus, data obtained by the laser interferometer 113 concerning the position of the reticle stage 111 are input to the main controller 115, which, based on these data and in real time, generates appropriate stage-motion command signals that are routed to the stage driver 114 and hence to the stage actuator 112. In this way, accurate real-time feedback control of the position of the reticle stage 111 is achieved.

Attached downstream of the optical column 101 to the base 116 is a wafer chamber 106 (another vacuum process chamber). The wafer chamber 106 contains an environment that is evacuated to high vacuum by a vacuum pump (not shown but well understood in the art). The wafer chamber 106 also contains a condenser lens (projection lens) 124, a beam-scanning deflector 125, and a wafer (lithographic substrate) W, arranged in this order, downstream of the reticle R. The wafer W is moved into and out of the wafer chamber 106 via a wafer-conveyance mechanism through a load chamber 41 and a load-lock chamber 43 that are connected in series to the wafer chamber 106. Details of the wafer-conveyance mechanism and manner of movement are described later below.

The wafer chamber 106 also contains a wafer stage 131 having an upstream-facing surface on which is mounted a wafer chuck 130. A wafer W or other suitable lithographic substrate is secured to the wafer chuck 130 by electrostatic attraction or other suitable means. So as to be imprintable with an image of the pattern projected from the reticle R, the upstream-facing surface of the wafer W is coated with an exposure-sensitive material termed a "resist."

The optical components situated between the reticle R and the wafer W and within the wafer chamber 106 constitute a "projection-optical system." The projection-optical system comprises the projection lens 124 that condenses the electron beam that has passed through the reticle R and forms a resolved image, of the illuminated portion of the reticle, on a corresponding prescribed region on the surface of the wafer W. Proper placement of the projected image on the wafer is achieved by the deflector 125. The projection-optical system also includes various aberration-correction lenses and a contrast-aperture diaphragm (not shown).

The wafer stage 131 is movable at least in the X- and Y-directions so as to facilitate scanning exposure of subfields from the reticle R to the wafer W. This movability is provided by a stage actuator 132 shown at the left side of the wafer stage 131. The stage actuator 132 is connected to the main controller 115 via a stage driver 134. The main controller 115 generates stage-motion command signals that are routed to the stage driver 134 and hence to the stage actuator 132 for controlled motions of the wafer W relative to the projection-optical system. The position of the wafer stage 131 is monitored by a laser interferometer 133, shown at the right of the wafer stage 131. The laser interferometer 133 is connected to the main controller 115. Thus, data obtained by the laser interferometer 133 concerning the position of the reticle stage 131 are input to the main controller 115, which, based on these data and in real time, generates appropriate stage-motion command signals that are routed to the stage driver 134 and hence to the stage actuator 132. In this way, accurate real-time feedback control of the position of the reticle stage 131 is achieved.

The illumination-optical system and projection-optical system are exemplary "CPB optical systems," as this term is generally used herein.

Figure 1A:
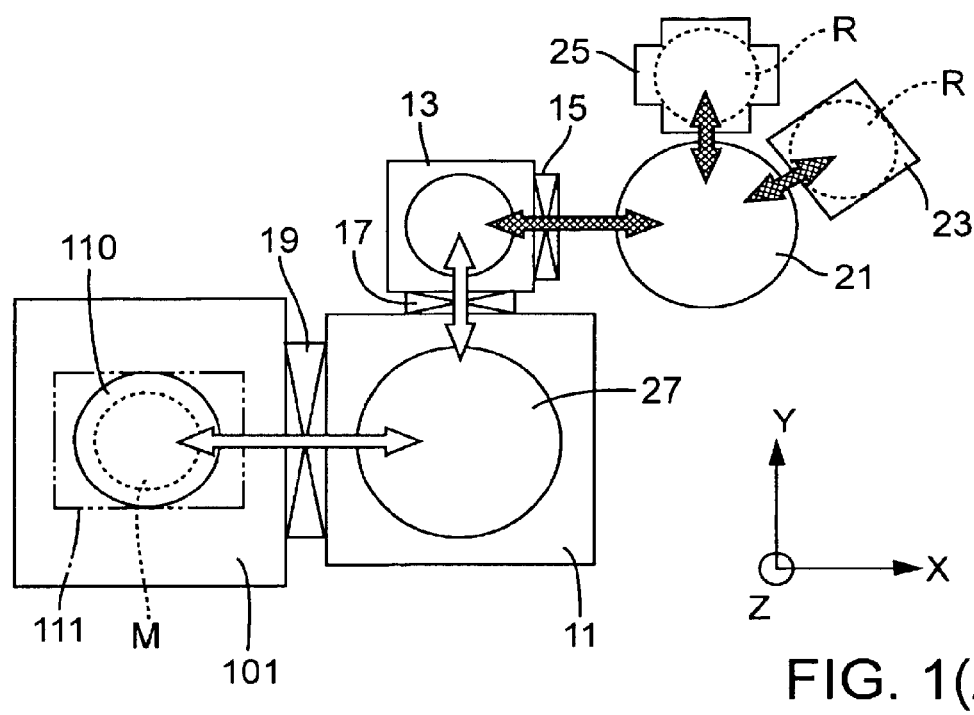
FIG. 1(A) is a plan view schematically depicting a reticle-conveyance device (robotic reticle-manipulator) according to a representative embodiment.

A representative embodiment of a reticle-conveyance device is shown in FIG. 1(A). It will be understood that the depicted embodiment, while useful for conveying a reticle, can be used with equal facility for conveying a wafer or other substrate, or other object in general. The depicted reticle-conveyance device transports a reticle R, typically stored in a storage cassette 23 located outside microlithography system until time for use, to the reticle stage 111 located inside the optical column 101. Actual transport is achieved using at least one remote-controlled robotic manipulator.

Since the optical column 101 is a vacuum chamber, the robotic manipulator(s) moving the reticle from outside the optical column to inside the optical column moves the reticle through at least one "passage chamber" attached to the optical column. In the depicted embodiment (FIG. 1(A)), two passage chambers are used, namely the load chamber 11 and the load-lock chamber 13. The load chamber 11 is connected to the optical column 101 via a gate valve 19 and communicates with the load-lock chamber 13 via a gate valve 17. The entrance to the load-lock chamber 13 is a gate valve 15, on the other side of which is the external environment. The load-lock chamber 13 is connected to a vacuum pump (not shown) used for producing a high vacuum as required inside the load-lock chamber.

Conveying of a reticle R from outside to inside the optical column 101 occurs by the following sequence of events. Outside the optical column 101 reticles R normally are stored in the reticle cassette 23. A reticle R is removed from the cassette 23 by a first robotic manipulator 21, which conveys the reticle to a pre-aligner 25, at which reticle-pre-alignment is performed as required.

After the reticle R is pre-aligned, the first robotic manipulator 21 removes the reticle R from the pre-aligner 25; the gate valve 15 of the load-lock chamber 13 is opened, and the first robotic manipulator 21 conveys the reticle R to inside the load-lock chamber 13. (Alternatively, if no reticle pre-alignment is necessary, the first robotic manipulator 21 can move the reticle directly from the cassette 23 through the gate valve 15 to inside the load-lock chamber 13.) The gate valve 15 is closed, and the inside of the load-lock chamber 13 is evacuated to a target vacuum level, typically at or approximately the vacuum level prevailing inside the optical column 101. (In FIG. 1(A) the shaded arrows depict the paths of the reticle R as it is being conveyed by the first robotic manipulator 21.)

After the interior of the load-lock chamber 13 has reached the prescribed vacuum level, the gate valve 17 between the load-lock chamber 13 and the load chamber 21 is opened. A second robotic manipulator 27, typically situated inside the load chamber 11, picks up the reticle R from the load-lock chamber 13 and transfers the reticle to the load chamber 11, after which transfer the gate valve 17 is closed. The gate valve 19 between the load chamber 11 and the optical column 101 is opened, and the second robotic manipulator 27 conveys the reticle R from the load chamber 11 to the optical column 101. In the optical column is the reticle stage 111, to which is mounted the reticle chuck 110. The reticle chuck 110 receives the reticle R from the second robotic manipulator 27. (In FIG. 1(A) the open arrows denote the paths of the reticle R being conveyed by the second robotic manipulator 27.)

Figure 1B:
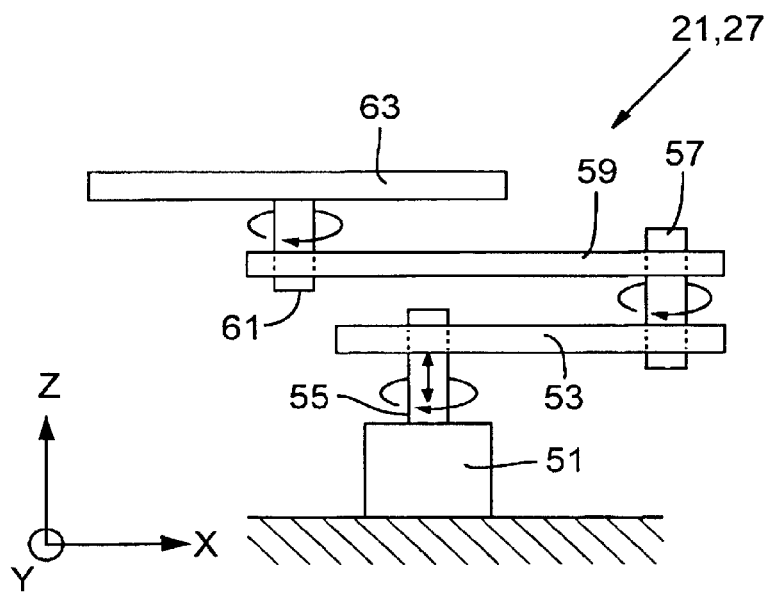
FIG. 1(B) is an elevational view of the reticle-conveyance device of FIG. 1(A).

Referring now to FIG. 1(B), an embodiment of a robotic manipulator 21, 27 is shown (note that the two robotic manipulators 21, 27 can have the same configuration). This particular embodiment of a robotic manipulator can move the reticle, substrate, or other object in any of the X-, Y- and Z-directions relative to the CPB optical system. The robotic manipulator 21, 27 comprises a base 51, a first arm 53, a second arm 59, and a holding member 63. The base 51 comprises a rotatable shaft 55 to which a proximal end of the first arm 53 is attached, thereby providing the first arm 53 with pivotability within its respective X-Y plane as well as movability in the Z-direction. Note that the base 51 and shaft 55 are "stationary" compared to other portions of the robotic manipulator such as the first arm 53 that exhibit displacement motion relative to the CPB optical system. The distal end of the first arm 53 is mounted to a proximal end of the second arm 59 by means of a shaft 57 that allows the second arm 59 to pivot within its respective X-Y plane relative to the first arm 53. The distal end of the second arm 59 is attached via a shaft 61 to a holding member 63, wherein the shaft 59 allows the holding member 63 to pivot within its respective X-Y plane relative to the second arm 59. The object to be conveyed (e.g., reticle or substrate) is loaded onto the holding member 63 for conveyance. In this embodiment the first arm 53, the second arm 59, and the holding member 63 are "moving members" that move, during actuation of the robotic manipulator, relative to the CPB optical system and thus relative to beam-controlling magnetic fields established within the CPB optical system. Similarly, the shafts 57, 61 also are moving members because movement of the first arm 53 and of the second arm 59 causes corresponding motions of the shafts 57, 61, respectively, relative to the CPB optical system.

The moving members (and optionally other components) of the robotic manipulator 21, 27 are "substantially non-magnetic." This means that the moving members need not be absolutely non-magnetic, so long as any residual magnetic property of the members is insufficient to perturb the charged particle beam more than a specified amount as the moving members move relative to the CPB optical system. The "specified amount" is a pre-determined tolerance of beam-perturbation (caused by movement of the moving members) that still can yield desired exposure accuracy. So as to be "substantially non-magnetic," each of the first arm 53, second arm 59, holding member 63, and shafts 57, 61 desirably is made of a substantially non-magnetic material.

Experiments were performed to determine the typical scope of "substantially non-magnetic." Various materials were investigated, including aluminum (Al), titanium (Ti), 304 stainless steel, 316 stainless steel, SiC, and various ceramics. The relative magnetic permeability of these materials is as follows:

| | |
|---|---|
| Al | 1.00000 |
| Ti | 1.00005 |
| 304 SS | 1.018 |
| 316 SS | 1.003 |
| SiC | 1.0001 |

Considered from the standpoint of influence on magnetic field, Al, Ti, and SiC (as an exemplary ceramic) were found to be desirable "substantially non-magnetic" materials. Hence, a substantially non-magnetic material is a material having a relative magnetic permeability of 1.0005 or less. Of materials having a relative magnetic permeability within this range, from the standpoint of mechanical strength, Al was not always suitable for members including hinge or pivot features in which friction could be limiting (but Al was suitable in many instances for static members such as arms lacking hinge or pivot features). Stainless steel, while having satisfactory mechanical strength, exhibited a magnetic-field perturbation that simply was too pronounced for many applications.

The robotic manipulator 21, 27 conveys the reticle R (as a representative object) by pivoting motions of the arms 53, 59 (about their respective shafts 55, 57) and holding member 63 within their respective X-Y planes and by elevation of the first arm 53 in the Z-axis direction. Since the arms 53, 59, shafts 57, 61, and holding member 63 are each made of a substantially non-magnetic material, movement of any of these components near a magnetic field inside either chamber 101, 106 does not perturb the magnetic field significantly. As a result, using the robotic manipulator according to this embodiment, exposures can be performed simultaneously as a new reticle is being conveyed for subsequent use inside the optical column 101 or as a used reticle is being conveyed back to a storage cassette, without concern that a beam-perturbing magnetic-field fluctuation will be generated from displacements of the moving members of the manipulator. In other words, any magnetic-field fluctuation generated by motion of the moving members of the manipulator 21 is too small to perturb the trajectory of the electron beam significantly.

Similarly to manipulation of the reticle R, as described above, by the robotic manipulators 21, 27, it will be understood that the wafer W or other substrate is manipulated in a similar manner using at least one robotic manipulator that does not produce a significant beam-perturbing magnetic-field fluctuation. Specifically, according to one embodiment, a first robotic manipulator such as item 21 in FIG. 1(A) is used for transferring a wafer W from a wafer cassette, situated outside the wafer chamber 106, through the gate valve 45 into the load-lock chamber 43. The gate valve 45 is closed and the load-lock chamber 43 is evacuated to a desired vacuum level. Upon attaining the desired vacuum level in the load-lock chamber 43, the gate valve 47 opens and a second robotic manipulator such as item 27 in FIG. 1(A), desirably located inside the load chamber 41, transfers the wafer W from the load-lock chamber 43 through the gate valve 47 into the load chamber 41. The gate valve 47 closes and the gate valve 49 opens, allowing the second robotic manipulator to transfer the wafer W to the substrate chuck 130 on the substrate stage 131 for exposure. The second robotic manipulator is withdrawn into the load chamber 41 and the gate valve 49 closes. A reverse sequence of steps is used for transferring the wafer W (such as upon completion of exposure) from the wafer chamber 106 to a wafer cassette located outside the wafer chamber 106. In any event, at least the moving members of the robotic manipulator(s) used for transferring the wafer into and out of the wafer chamber 106 are substantially non-magnetic. Thus, any magnetic-field fluctuation generated by motion of the moving members of the manipulator(s) is too small to perturb the trajectory of the electron beam significantly.

Since actuation of the robotic manipulators does not produce any significant beam-perturbing magnetic fields, transfer of reticles and substrates can be performed as exposure (or other operation such as alignment or calibration involving critical placement of the beam) is being conducted. This ability to perform more tasks simultaneously yields higher throughput than conventionally.

Whereas the invention has been described in connection with a representative embodiment, the invention is not limited to that embodiment. On the contrary, the invention is intended to encompass all modifications, alternatives, and equivalents as may be included in the spirit and scope of the invention, as defined by the appended claims.

What is claimed is:

1. A charged-particle-beam (CPB) microlithography system, comprising:
    a CPB optical system situated and configured to irradiate a charged particle beam onto an exposure-sensitive surface of a lithographic substrate so as to transfer and imprint a resolved pattern on the exposure-sensitive surface; and
    a first robotic manipulator situated relative to the CPB optical system and configured for conveying an object relative to the CPB optical system, the first robotic manipulator comprising at least one moving member that moves, during actuation of the manipulator, relative to the CPB optical system, the at least one moving member being substantially non-magnetic, having a relative magnetic permeability of 1.0005 or less.

2. The CPB microlithography system of claim 1, wherein the first robotic manipulator is configured to convey a reticle to a reticle stage for exposure and from the reticle stage after exposure.

3. The CPB microlithography system of claim 1, wherein the first robotic manipulator is configured to convey a lithographic substrate to a substrate stage for exposure and from the substrate stage after exposure.

4. The CPB microlithography system of claim 1, wherein:
    the first robotic manipulator comprises multiple moving members including a first arm member and an object-holding member pivotably attached to the first arm member, the object-holding member being configured for holding the object as the first robotic manipulator moves the object in a vicinity of a magnetic field produced by the CPB optical system; and
    the first arm member and the holding member are each made of a substantially non-magnetic material.

5. The CPB microlithography system of claim 4, wherein the substantially non-magnetic material is selected from the group consisting of Ti, SiC, and other materials having a relative magnetic permeability of 1.0005 or less.

6. The CPB microlithography system of claim 4, wherein:
    the moving members of the first robotic manipulator further comprise a first shaft pivotably coupling the object-holding member to the first arm member; and
    the first shaft is made of a substantially non-magnetic material.

7. The CPB microlithography system of claim 6, wherein:
    the moving members of the first robotic manipulator further comprise a second arm member and a second shaft connecting the first and second arm members together in a manner allowing the first arm member to pivot about the second shaft relative to the second arm member in response to actuation of the first robotic manipulator; and
    the second arm member and second shaft are each made of a substantially non-magnetic material.

8. The CPB microlithography system of claim 4, wherein:
    the moving members of the first robotic manipulator further comprise a second arm member and a shaft connecting the first and second arm members together in a manner allowing the first arm member to pivot about the shaft relative to the second arm member in response to actuation of the first robotic manipulator; and
    the second arm member and shaft are each made of a substantially non-magnetic material.

9. The CPB microlithography system of claim 1, wherein:
    the CPB optical system is contained inside a vacuum process chamber to which is connected a load chamber; and
    the first robotic manipulator is configured, when actuated, to move the object from the load chamber to the vacuum process chamber and from the vacuum process chamber to the load chamber.

10. The CPB microlithography system of claim 1, wherein:
    the CPB optical system is contained inside a vacuum process chamber to which is connected a load chamber and a load-lock chamber; and
    the first robotic manipulator is configured to move, when actuated, the object from the load-lock chamber to the load chamber, from the load chamber to the vacuum process chamber, from the vacuum process chamber to the load chamber, and from the load chamber to the load-lock chamber.

11. The CPB microlithography system of claim 10, wherein the first robotic manipulator is located inside the load chamber.

12. The CPB microlithography system of claim 10, wherein:
the vacuum process chamber comprises an optical column containing an illumination-optical system and a reticle stage; and
the first robotic manipulator is configured to move, when actuated, a reticle relative to the illumination-optical system, the movement being from the load-lock chamber to the load chamber, from the load chamber to the reticle stage, from the reticle stage to the load chamber, and from the load chamber to the load-lock chamber.

13. The CPB microlithography system of claim 12, further comprising a second robotic manipulator situated and configured to move, when actuated, the reticle relative to the illumination-optical system, the movement being from an external environment to the load-lock chamber and from the load-lock chamber to the external environment.

14. The CPB microlithography system of claim 13, wherein;
the second robotic manipulator comprises at least one moving member that moves, during actuation of the second robotic manipulator, relative to the illumination-optical system; and
the at least one moving member is substantially non-magnetic.

15. The CPB microlithography system of claim 10, wherein:
the vacuum chamber comprises a wafer chamber containing a projection-optical system and a substrate stage; and
the first robotic manipulator is configured to move, when actuated, a lithographic substrate relative to the projection-optical system, the movement being from the load-lock chamber to the load chamber, from the load chamber to the substrate stage, from the substrate stage to the load chamber, and from the load chamber to the load-lock chamber.

16. The CPB microlithography system of claim 15, further comprising a second robotic manipulator situated and configured to move, when actuated, the substrate relative to the projection-optical system, the movement being from an external environment to the load-lock chamber, and from the load-lock chamber to the external environment.

17. The CPB microlithography system of claim 16, wherein;
the second robotic manipulator comprises at least one moving member that moves, during actuation of the second robotic manipulator, relative to the projection-optical system; and
the at least one moving member is substantially non-magnetic.

18. The CPB microlithography system of claim 15, further comprising a second robotic manipulator, wherein
the vacuum process chamber further comprises an optical column containing an illumination-optical system and a reticle stage, to which optical column are connected a second load chamber and a second load-lock chamber; and
the second robotic manipulator is configured to move, when actuated, a reticle relative to the illumination-optical system, the movement being from the second load-lock chamber to the second load chamber, from the second load chamber to the reticle stage, from the reticle stage to the second load chamber, and from the second load chamber to the second load-lock chamber.

19. A charged-particle-beam (CPB) microlithography system, comprising:
a first vacuum process chamber;
an illumination-optical system and reticle stage situated inside the first vacuum process chamber;
a first load chamber connected to the first vacuum process chamber;
a first robotic manipulator situated and configured to move, when actuated, a reticle relative to the illumination-optical system, the movement including from the first load chamber to the reticle stage in the first vacuum process chamber, and from the reticle stage to the first load chamber, the first robotic manipulator comprising moving members that are substantially non-magnetic, having a relative magnetic permeability of 1.0005 or less;
a second vacuum process chamber;
a projection-optical system and substrate stage situated inside the second vacuum process chamber;
a second load chamber connected to the second vacuum process chamber; and
a second robotic manipulator situated and configured to move, when actuated, a substrate relative to the projection-optical system, the movement including from the second load chamber to the substrate stage in the second vacuum process chamber, and from the substrate stage to the second load chamber, the second robotic manipulator comprising moving members that are substantially non-magnetic, having a relative magnetic permeability of 1.0005 or less.

20. The CPB microlithography system of claim 19, wherein the respective moving members of the first and second robotic manipulators are made of a material selected from the group consisting of Ti, SiC, and other materials having a relative magnetic permeability of 1.0005 or less.

21. The CPB microlithography system of claim 19, further comprising a first load-lock chamber connected to the first load chamber, and a second load-lock chamber connected to the second load chamber, wherein the first robotic manipulator is further configured to move, when actuated, the reticle from the first load-lock chamber to the first load chamber and from the first load chamber to the first load-lock chamber; and the second robotic manipulator is further configured to move the substrate from the second load-lock chamber to the second load chamber and from the second load chamber to the second load-lock chamber.

22. The CPB microlithography system of claim 21, wherein:
the first robotic manipulator is located in the first load chamber; and
the second robotic manipulator is located in the second load chamber.

23. The CPB optical system of claim 20, further comprising:
a third robotic manipulator situated and configured to move, when actuated, the reticle from an external environment to inside the first load-lock chamber and from the first load-lock chamber to the external environment; and
a fourth robotic manipulator situated and configured to move, when actuated, the substrate from the external environment to inside the second load-lock chamber and from the second load-lock chamber to the external environment, wherein the third and fourth robotic manipulators each comprise respective moving members that are substantially non-magnetic, having relative magnetic permeabilities of 1.0005 or less.

24. The CPB optical system of claim 23, wherein the respective moving members of the third and fourth robotic manipulators are made of a material selected from the group consisting of Ti, SiC, and other materials having a relative magnetic permeability of 1.0005 or less.

25. The CPB optical system of claim 24, wherein the respective moving members of the first and second robotic manipulators are made of a material selected from the group consisting of Ti, SiC, and other materials having a relative magnetic permeability of 1.0005 or less.

26. In a charged-particle-beam (CPB) microlithography method in which a charged particle beam is directed through a CPB optical system that produces a beam-controlling magnetic field so as to imprint a pattern on an exposure-sensitive surface of a lithographic substrate, a method for conveying an object relative to the CPB optical system without causing a significant perturbation of the beam-controlling magnetic field, the method comprising:

placing the object on a moving member of a robotic manipulator situated relative to the CPB optical system and configured for conveying an object relative to the CPB optical system, the moving member being substantially non-magnetic, having a relative magnetic permeability of 1.0005 or less; and actuating the robotic manipulator so as to move the object relative to the CPB optical system.

27. The method of claim 26, wherein:

the object is a reticle;

the CPB optical system comprises an illumination-optical system; and actuation of the robotic manipulator also moves the reticle relative to the illumination-optical system.

28. The method of claim 27, wherein actuation of the robotic manipulator also places the reticle on a reticle stage of the illumination-optical system and removes the reticle from the reticle stage.

29. The method of claim 26, wherein:

the object is a substrate;

the CPB optical system comprises a projection-optical system; and actuation of the robotic manipulator also moves the substrate relative to the projection-optical system.

30. The method of claim 29, wherein actuation of the robotic manipulator also places the substrate on a substrate stage of the projection-optical system and removes the substrate from the substrate stage.

31. The method of claim 26, wherein the step of actuating the robotic manipulator occurs while performing a lithographic exposure.

* * * * *